(12) United States Patent
Chueh et al.

(10) Patent No.: US 10,670,870 B2
(45) Date of Patent: Jun. 2, 2020

(54) HEAD-MOUNTED DISPLAY

(71) Applicants: STARVR CORPORATION, New Taipei (TW); Acer Incorporated, New Taipei (TW)

(72) Inventors: Yen-Chou Chueh, New Taipei (TW); Hui-Ping Sun, New Taipei (TW); Wei-Chih Wang, New Taipei (TW); Kuan-Lin Chen, New Taipei (TW)

(73) Assignees: STARVR CORPORATION, New Taipei (TW); Acer Incorporated, New Taipei (TW)

( * ) Notice: Subject to any disclaimer, the term of this patent is extended or adjusted under 35 U.S.C. 154(b) by 0 days.

(21) Appl. No.: 16/556,243

(22) Filed: Aug. 30, 2019

(65) Prior Publication Data

US 2020/0073131 A1    Mar. 5, 2020

(30) Foreign Application Priority Data

Aug. 31, 2018   (TW) .............................. 107130731 A

(51) Int. Cl.
*G06F 1/16* (2006.01)
*G02B 27/01* (2006.01)
*H05K 7/16* (2006.01)

(52) U.S. Cl.
CPC ..... *G02B 27/0176* (2013.01); *G02B 27/0149* (2013.01); *H05K 7/16* (2013.01); *G02B 2027/0169* (2013.01)

(58) Field of Classification Search
CPC ... G02B 27/017; G02B 27/0176; G06F 1/163; F16M 13/04

USPC .......................................... 361/679.03; 345/8
See application file for complete search history.

(56) References Cited

U.S. PATENT DOCUMENTS

| | | | | |
|---|---|---|---|---|
| 5,767,820 | A * | 6/1998 | Bassett | G02B 27/017 345/7 |
| 8,237,627 | B2 * | 8/2012 | Nakabayashi | G02B 27/0176 2/414 |
| 8,959,667 | B2 * | 2/2015 | Nakabayashi | G02B 27/0176 2/417 |
| 8,984,671 | B2 * | 3/2015 | Yasuda | G02B 27/0176 2/417 |
| 9,778,467 | B1 | 10/2017 | White et al. | |

(Continued)

FOREIGN PATENT DOCUMENTS

| | | |
|---|---|---|
| CN | 106575041 | 4/2017 |
| CN | 207516643 | 6/2018 |
| TW | M519689 | 4/2016 |

*Primary Examiner* — Anthony Q Edwards
(74) *Attorney, Agent, or Firm* — JCIPRNET

(57) ABSTRACT

A head-mounted display including a body, a bearing base, a separation plate, a knob, a guiding element, a first gear, a second gear and a head belt set is provided. The separation plate is fixed inside the bearing base. The knob is pivoted to the bearing base and located outside the bearing base. The guiding element is pivoted to the bearing base and located inside the bearing base, and is configured to be driven by the knob to rotate. The guiding element includes a shaft portion passing through the bearing base and the separation plate. The first gear and the second gear are sleeved on the shaft portion, and are separated from each other by the separation plate. The head belt set connects the body and the bearing base. The head belt set includes an auxiliary head belt, a first side head belt and a second side head belt.

11 Claims, 5 Drawing Sheets

(56) References Cited

U.S. PATENT DOCUMENTS

| | | | |
|---|---|---|---|
| 10,209,738 B1* | 2/2019 | Tompkins | G06F 1/163 |
| 10,365,494 B2* | 7/2019 | Lin | G06F 1/163 |
| 2002/0118506 A1* | 8/2002 | Saito | G06F 1/163 |
| | | | 361/679.03 |
| 2004/0008158 A1* | 1/2004 | Chi | G02B 27/0176 |
| | | | 345/8 |
| 2007/0223766 A1* | 9/2007 | Davis | H04M 1/05 |
| | | | 381/379 |
| 2010/0050325 A1* | 3/2010 | Wang-Lee | A42B 3/145 |
| | | | 2/418 |
| 2014/0266987 A1* | 9/2014 | Magyari | G02B 5/10 |
| | | | 345/8 |
| 2017/0337737 A1 | 11/2017 | Edwards et al. | |
| 2018/0295733 A1* | 10/2018 | Wen | H05K 5/0217 |
| 2018/0321707 A1* | 11/2018 | Hu | G02C 5/22 |
| 2019/0037715 A1* | 1/2019 | Chen | H05K 5/0017 |
| 2019/0159354 A1* | 5/2019 | Zheng | G02B 7/12 |
| 2019/0196536 A1* | 6/2019 | Wang | G06F 1/163 |

* cited by examiner

HEAD-MOUNTED DISPLAY

CROSS-REFERENCE TO RELATED APPLICATION

This application claims the priority benefit of Taiwan application serial no. 107130731, filed on Aug. 31, 2018. The entirety of the above-mentioned patent application is hereby incorporated by reference herein and made a part of this specification.

BACKGROUND OF THE INVENTION

Field of the Invention

The invention relates to a display device, and particularly relates to a head-mounted display.

Description of Related Art

The so-called virtual reality refers to the use of computer simulation to generate a three-dimensional (3D) virtual environment that provides users with sensory simulations such as sight, smell or touch. As a result, the users can acquire a sensation of immersion as if they are present on the scene.

Generally speaking, the user needs to wear a head-mounted display to obtain the image of the 3D virtual environment. The head-mounted display may be roughly divided into two main parts, that is, a body and a head belt set, and the head belt set may be roughly divided into two side head belts passing over the left side and the right side of the user's head and an auxiliary head belt passing over the top of the user's head. By adjusting the lengths of the two side head belts or the auxiliary head belt, the user is able to control the degree of tightness when wearing the head-mounted display. Although the lengths of the two side head belts may be adjusted synchronously through the same adjustment mechanism, the length of the auxiliary head belt needs to be adjusted through another adjustment mechanism. Therefore, in the case where the lengths of the two side head belts and the length of the auxiliary head belt cannot be synchronously adjusted, the user needs to spend more time adjusting the degree of tightness when wearing the head-mounted display.

SUMMARY OF THE INVENTION

The invention provides a head-mounted display that is convenient to use.

The head-mounted display of the invention includes a body, a bearing base, a separation plate, a knob, a guiding element, a first gear, a second gear and a head belt set. The bearing base is disposed opposite to the body. The separation plate is fixed inside the bearing base. The knob is pivoted to the bearing base and located outside the bearing base. The guiding element is pivoted to the bearing base and located inside the bearing base, and is configured to be driven by the knob to rotate. The guiding element includes a shaft portion passing through the bearing base and the separation plate. The first gear and the second gear are sleeved on the shaft portion, and are separated from each other by the separation plate. The head belt set connects the body and the bearing base. The head belt set includes an auxiliary head belt, a first side head belt and a second side head belt. The auxiliary head belt has an auxiliary gear rack portion extending into the bearing base, and the first gear is engaged with an auxiliary inner gear rack of the auxiliary gear rack portion. The first side head belt has a first gear rack portion extending into the bearing base, and the auxiliary gear rack portion and the first gear rack portion are separated from each other by the separation plate. The second side head belt has a second gear rack portion extending into the bearing base. Herein the second gear rack portion is stacked on the first gear rack portion, and the second gear is engaged with a first inner gear rack of the first gear rack portion and a second inner gear rack of the second gear rack portion.

Based on the foregoing, the head-mounted display of the invention may synchronously control the movements of the first side head belt, the second side head belt and the auxiliary head belt, so that the degree of tightness may be quickly adjusted when the user wears the head-mounted display. In other words, the head-mounted display of the invention is convenient to use.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
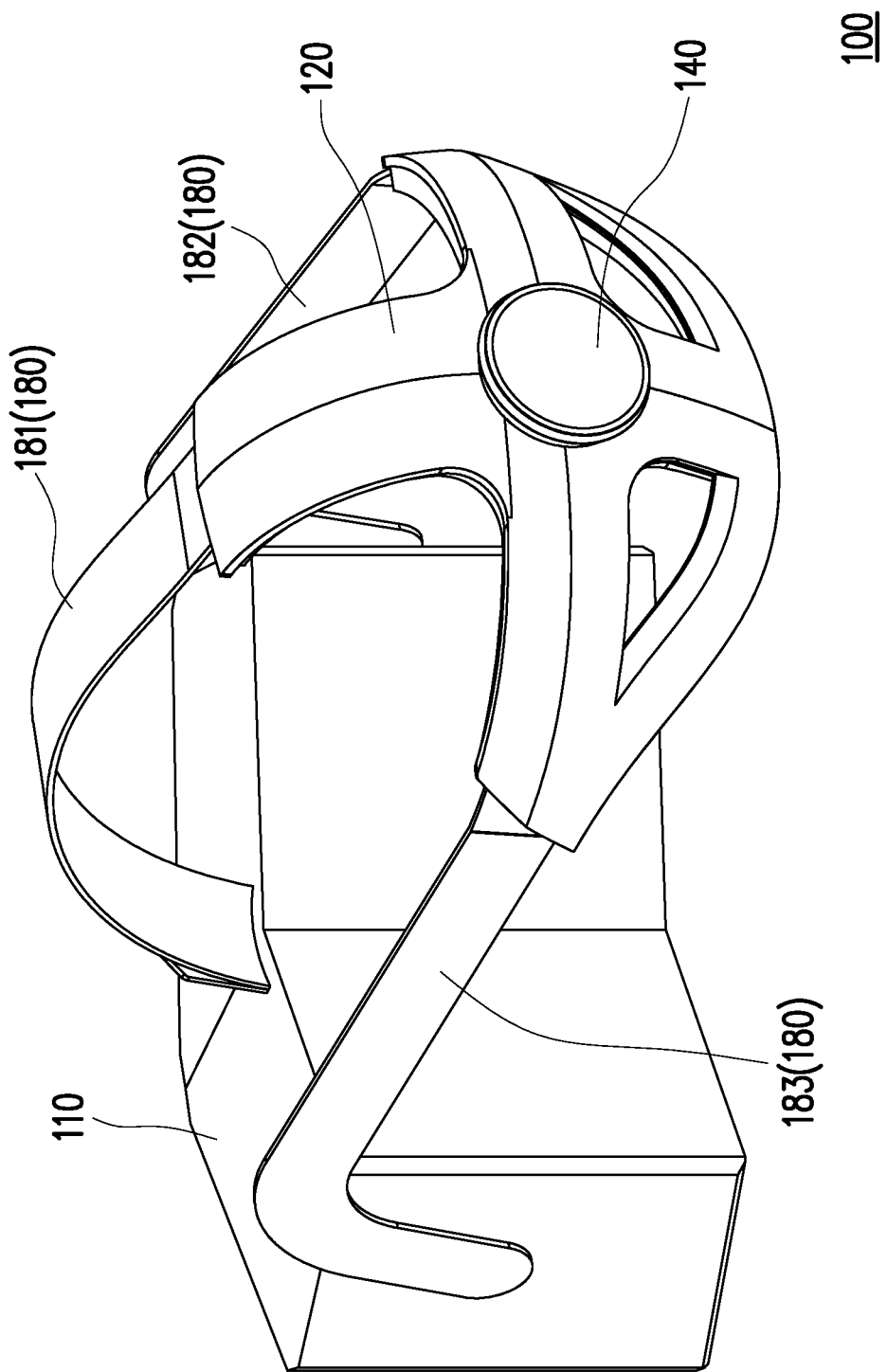
FIG. 1 is a schematic view of a head-mounted display according to an embodiment of the invention.
Figure 2A:
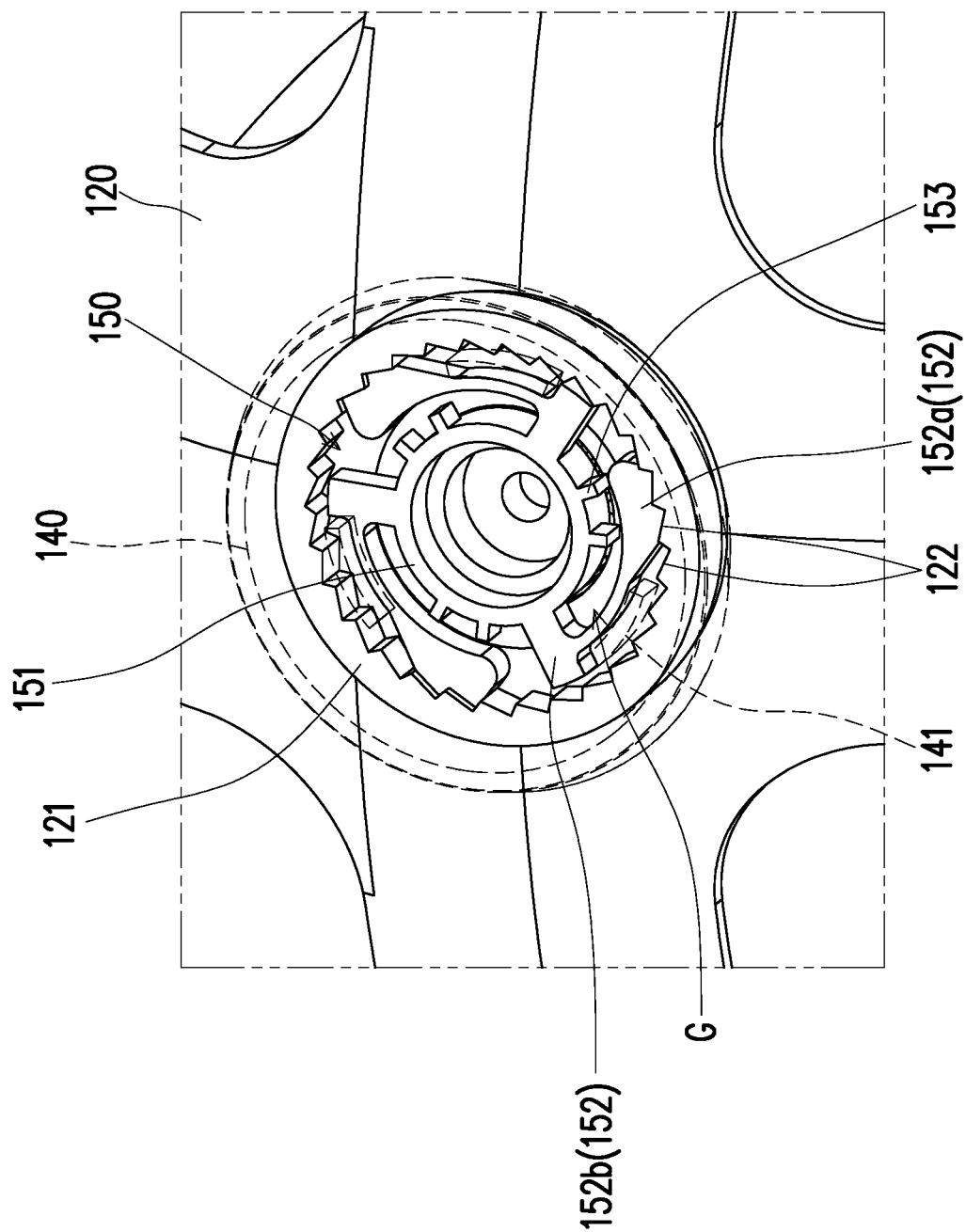
FIG. 2A and FIG. 2B are schematic partial enlarged views showing a knob in a head-mounted display from two different viewing angles respectively according to an embodiment of the invention.
Figure 2B:
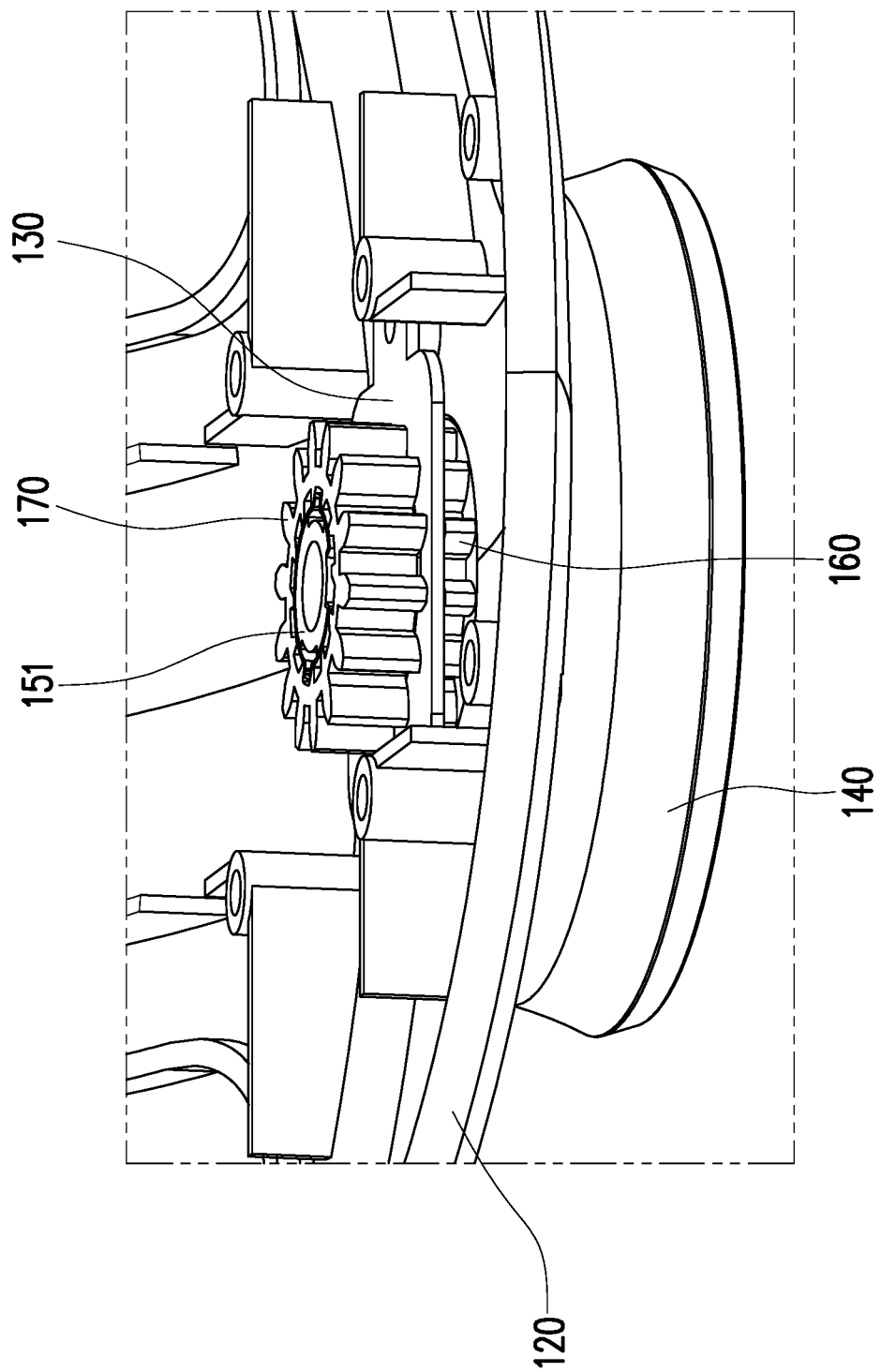
Figure 3:
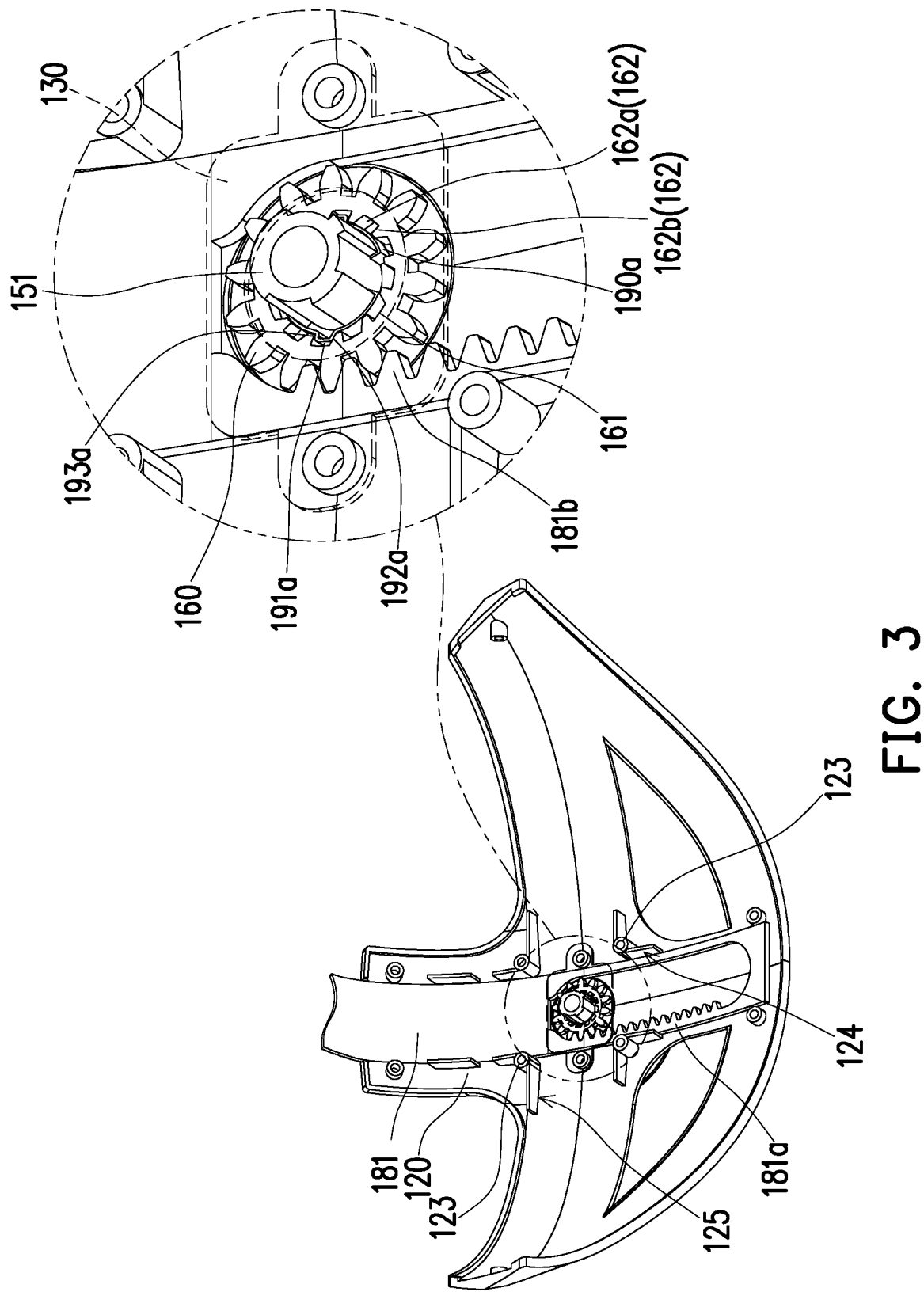
FIG. 3 is a schematic partial enlarged view showing a bearing base and an auxiliary head belt in a head-mounted display according to an embodiment of the invention.
Figure 4:
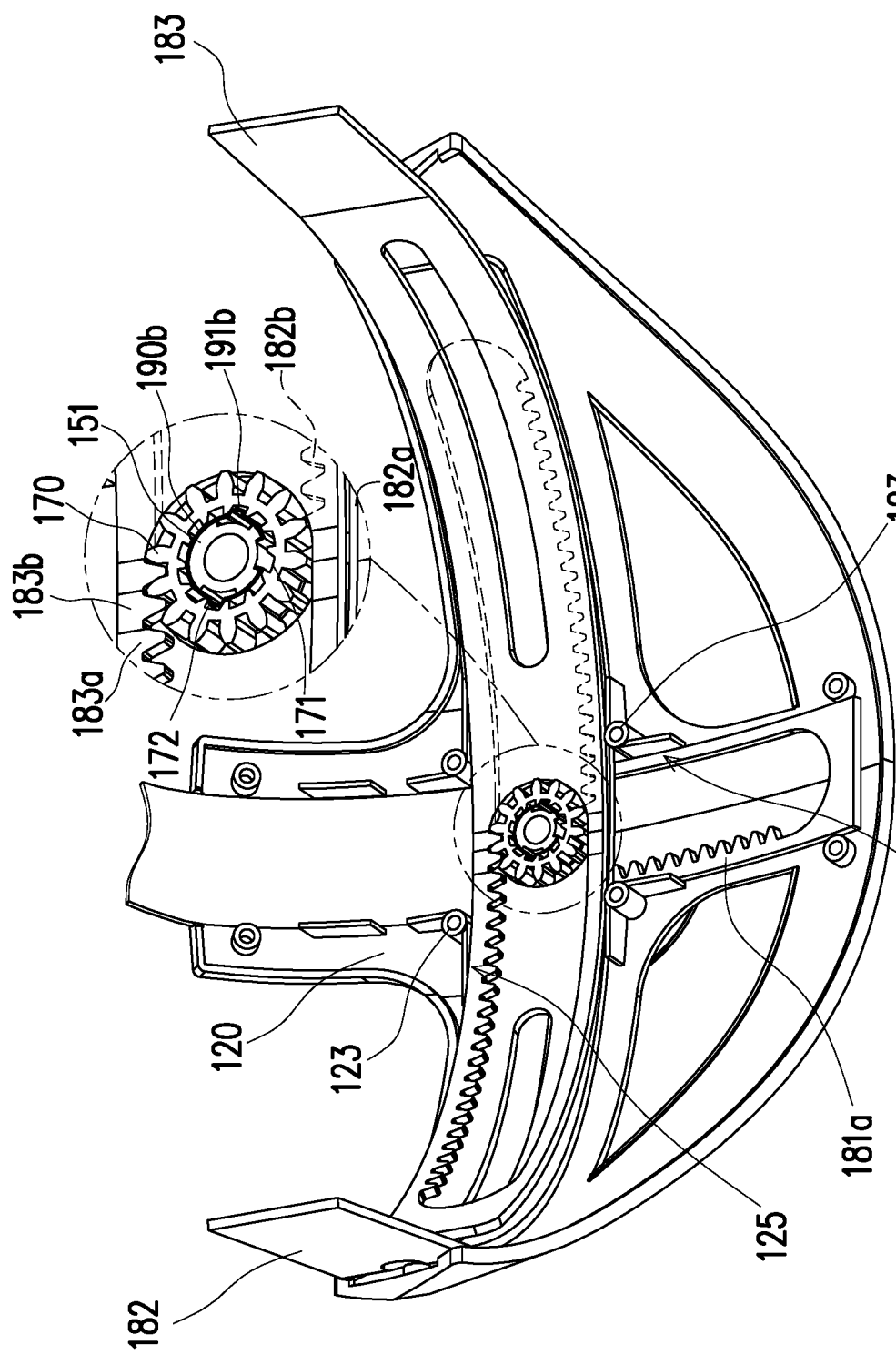
FIG. 4 is a schematic partial enlarged view showing a bearing base, an auxiliary head belt, a first side head belt and a second side head belt in a head-mounted display according to an embodiment of the invention.

FIG. 1 is a schematic view of a head-mounted display according to an embodiment of the invention. FIG. 2A and FIG. 2B are schematic partial enlarged views showing a knob in a head-mounted display from two different viewing angles respectively according to an embodiment of the invention. FIG. 3 is a schematic partial enlarged view showing a bearing base and an auxiliary head belt in a head-mounted display according to an embodiment of the invention. FIG. 4 is a schematic partial enlarged view showing a bearing base, an auxiliary head belt, a first side head belt and a second side head belt in a head-mounted display according to an embodiment of the invention. It should be particularly noted that the knob 140 of FIG. 2A is illustrated in dashed lines to clearly present the internal structural configuration. FIG. 2B omits a portion of the housing of the bearing base 120 and omits the head belt set 180 in order to clearly present the internal structural configuration. FIG. 3 omits a portion of the housing of the bearing base 120 and omits the second gear 170 and illustrates the separation plate 130 in dashed lines in order to clearly present the internal structural configuration. FIG. 4 omits a portion of the housing of the bearing base 120 in order to clearly present the internal structural configuration.

With reference to FIG. 1, FIG. 2A and FIG. 2B first, in this embodiment, a head-mounted display 100 includes a body 110, a bearing base 120, a separation plate 130, a knob 140, a guiding element 150, a first gear 160, a second gear 170 and a head belt set 180. The body 110 is configured to send and receive signals or information, process signals or information, receive power and display images, and is disposed opposite to the bearing base 120. More specifically, when the user wears the head-mounted display 100, the body 110 is closely placed in front of the user's eyes, and the bearing base 120 abuts against the back of the user's head. On the other hand, the knob 140 is pivoted to the bearing base 120 and located outside the bearing base 120. That is to say, the knob 140 and the body 110 are respectively located at two opposite sides of the bearing base 120. The guiding element 150 is pivoted to the bearing base 120 and located inside the bearing base 120, and is covered by the knob 140. Furthermore, the knob 140 and the guiding element 150 may be separated from each other or may abut against each other due to the rotation of the knob 140. When the knob 140 is rotated to push against the guiding element 150, the guiding element 150 may rotate synchronously with the knob 140.

The bearing base 120 includes an internal ratchet portion 121. The knob 140 is pivoted to the internal ratchet portion 121 and is located on the internal ratchet portion 121, and includes a driving portion 141 (a plurality of driving portions 141 are schematically illustrated herein). The plurality of driving portions 141 are, for example, bumps that protrude from one side of the knob 140 facing the bearing base 120, and are located inside the internal ratchet portion 121. The guiding element 150 includes a shaft portion 151, a positioning portion 152 and a stopping portion 153. The shaft portion 151 is pivoted to the internal ratchet portion 121 and located inside the internal ratchet portion 121. The positioning portion 152 and the stopping portion 153 are connected to the outer peripheral surface of the shaft portion 151. More specifically, the positioning portion 152 and the stopping portion 153 are located inside the internal ratchet portion 121, and the positioning portion 152 is configured to be engaged with a plurality of internal ratchet teeth 122 of the internal ratchet portion 121. On the other hand, the number of the positioning portion 152 and the number of the stopping portion 153 may each be more than one, such as the same as the number of the plurality of driving portions 141. Each of the positioning portions 152 has an engaging portion 152a and a driven portion 152b opposite to each other. Herein the plurality of driven portions 152b and the plurality of stopping portions 153 are connected to the outer peripheral surface of the shaft portion 151. Each of the stopping portions 153 is located at one side of the corresponding driven portion 152b, or one stopping portion 153 is disposed between any two adjacent driven portions 152b.

As described above, each of the engaging portions 152a is connected to the corresponding driven portion 152b and extends to one side of the corresponding stopping portion 153, and engages at least a portion of the internal ratchet teeth 122 by one side facing away from the shaft portion 151. On the other hand, each of the driving portions 141 is located between the corresponding engaging portion 152a and the driven portion 152b. In other words, a yielding space exists between each engaging portion 152a and the corresponding driven portion 152b to accommodate the corresponding driving portion 141. For example, the knob 140 is configured to be rotated forward or reversed relative to the bearing base 120. When the knob 140 is rotated forward relative to the bearing base 120, each driving portion 141 is rotated relative to the internal ratchet portion 121 to push the corresponding driven portion 152b, so that the guiding element 150 is driven to be rotated synchronously in the same direction. When the knob 140 stops rotating, a structural interference is generated between the engaging portions 152a and the internal ratchet teeth 122. It is necessary to release the structural interference between the engaging portions 152a and the internal ratchet teeth 122 first, so that the knob 140 and the guiding element 150 may be rotated forward or reversed relative to the bearing base 120 as required.

When the knob 140 is reversed relative to the bearing base 120, each of the driving portions 141 pushes the corresponding engaging portion 152a so as to make the corresponding engaging portion 152a be elastically deformed toward the shaft portion 151, thereby releasing the structural interference between the engaging portions 152a and at least a portion of the internal ratchet teeth 122. On the other hand, a gap G is maintained between each engaging portion 152a and the shaft portion 151. Each stopping portion 153 is located inside the corresponding gap G, and each stopping portion 153 is configured to limit the deformation degree of the corresponding engaging portion 152a so as to prevent excessive deformation of the engaging portions 152a. Next, the knob 140 is reversed relative to the bearing base 120 continuously. Each driving portion 141 pushes the corresponding engaging portion 152a to drive the guiding element 150 to be rotated synchronously in the same direction. When the knob 140 stops rotating, a structural interference is generated between the engaging portions 152a and the internal ratchet teeth 122. It is necessary to release the structural interference between the engaging portions 152a and the internal ratchet teeth 122 first, so that the knob 140 and the guiding element 150 may be rotated forward or reversed relative to the bearing base 120 as required.

In addition to continuing to refer to FIG. 1, FIG. 2A and FIG. 2B, please refer to FIG. 3 and FIG. 4 simultaneously. In this embodiment, the separation plate 130 is fixed inside the bearing base 120, and the shaft portion 151 of the guiding element 150 passes through the bearing base 120 and the separation plate 130. The first gear 160 and the second gear 170 are sleeved on the shaft portion 151, and are separated from each other by the separation plate 130. The head belt set 180 connects the body 110 and the bearing base 120, and includes an auxiliary head belt 181, a first side head belt 182 and a second side head belt 183. When the user wears the head-mounted display 100, the first side head belt 182 and the second side head belt 183 respectively pass over the left side and the right side of the user's head, and the auxiliary head belt 181 passes over the top of the user's head. By adjusting the lengths of the auxiliary head belt 181, the first side head belt 182 and the second side head belt 183, it is possible to control the degree of tightness when the user wears the head-mounted display 100.

The auxiliary head belt 181 has an auxiliary gear rack portion 181a extending into the bearing base 120, and the first gear 160 is engaged with an auxiliary inner gear rack 181b of the auxiliary gear rack portion 181a. On the other hand, the first side head belt 182 has a first gear rack portion 182a extending into the bearing base 120, and the auxiliary gear rack portion 181a and the first gear rack portion 182a are separated from each other by the separation plate 130. The second side head belt 183 has a second gear rack portion 183a extending into the bearing base 120. Herein the second gear rack portion 183a is stacked on the first gear rack portion 182a, and the second gear 170 is engaged with a first inner gear rack 182b of the first gear rack portion 182a and a second inner gear rack 183b of the second gear rack portion 183a. More specifically, the separation plate 130 is located between the auxiliary gear rack portion 181a and the first gear rack portion 182a, and the first gear rack portion 182a is located between the separation plate 130 and the second gear rack portion 183a. The auxiliary gear rack portion 181a is perpendicular to the first gear rack portion 182a and the second gear rack portion 183a, and the auxiliary gear rack portion 181a, the first gear rack portion 182a and the second gear rack portion 183a may be moved relatively to each other.

When the knob 140 is rotated forward relative to the bearing base 120, the guiding element 150 is driven by the knob 140 to be rotated synchronously. At this time, the first gear 160 and the second gear 170 are also rotated synchronously. Herein the first gear 160 drives the auxiliary gear rack portion 181a to be moved in a direction perpendicular to the first gear rack portion 182a and the second gear rack portion 183a, and the second gear 170 drives the first gear rack portion 182a and the second gear rack portion 183a to be moved in two opposite directions respectively. In other words, with the integrated design of the knob 140 and the double gears (i.e., the first gear 160 and the second gear 170), the user may drive the double gears (i.e., the first gear 160 and the second gear 170) to be rotated by rotating the knob 140, and the auxiliary head belt 181, the first side head belt 182 and the second side head belt 183 may be driven to be moved synchronously by the synchronously rotating double gears. As a result, the degree of tightness when the user wears the head-mounted display 100 may be quickly adjusted.

In this embodiment, the bearing base 120 includes a plurality of limiting portions 123 located around the first gear 160 and the second gear 170. The limiting portions 123 are configured to define a first limiting channel 124 and a second limiting channel 125 that are perpendicular to each other. Furthermore, the auxiliary gear rack portion 181a is slidably disposed inside the first limiting channel 124, and the first gear rack portion 182a and the second gear rack portion 183a are slidably disposed inside the second limiting channel 125, so that the stability is improved when the auxiliary head belt 181, the first side head belt 182 and the second side head belt 183 are moved.

On the other hand, the head-mounted display 100 further includes a first elastic positioning element 190a and a second elastic positioning element 190b that are engaged with the shaft portion 151, such as elastic positioning rings. The first elastic positioning element 190a and the second elastic positioning element 190b are separated from each other by the separation plate 130. Herein the first elastic positioning element 190a is located between the first gear 160 and the shaft portion 151 and is surrounded by the first gear 160. The second elastic positioning element 190b is located between the second gear 170 and the shaft portion 151 and is surrounded by the second gear 170.

In this embodiment, the first elastic positioning element 190a may include a first elastic abutting portion 191a (a plurality of first elastic abutting portions 191a are schematically illustrated herein). The first elastic positioning element 190a and the shaft portion 151 are fixed to each other, and the first elastic abutting portions 191a are configured to abut against a plurality of slots 162 on an inner peripheral surface 161 of the first gear 160. Since the first elastic abutting portions 191a are engaged with the slots 162, the first gear 160 may be sleeved on the shaft portion 151 and rotated synchronously with the shaft portion 151. On the other hand, the second elastic positioning element 190b may include a second elastic abutting portion 191b (a plurality of second elastic abutting portions 191b are schematically illustrated herein). The second elastic positioning element 190b and the shaft portion 151 are fixed to each other, and the second elastic abutting portions 191b are configured to abut against a plurality of slots 172 on an inner peripheral surface 171 of the second gear 170. Since the second elastic abutting portions 191b are engaged with the slots 172, the second gear 170 may be sleeved on the shaft portion 151 and rotated synchronously with the shaft portion 151.

Furthermore, the first gear 160 and the first elastic positioning element 190a feature a one-way freewheeling design, and the second gear 170 and the second elastic positioning element 190b feature a one-way freewheeling design. Due to the one-way freewheeling design, when the movement of the auxiliary head belt 181 is temporarily restricted, the first gear 160 is temporarily unable to be rotated synchronously with the shaft portion 151, so that the first elastic positioning element 190a and the first gear 160 are slipped off. However, the second gear 170 may be still rotated synchronously with the shaft portion 151 to drive the first side head belt 182 and the second side head belt 183 to be moved. Alternatively, when the movements of the first side head belt 182 and the second side head belt 183 are temporarily restricted, the second gear 170 is temporarily unable to be rotated synchronously with the shaft portion 151, so that the second gear 170 and the second elastic positioning element 190b are slipped off. However, the first gear 160 may be still rotated synchronously with the shaft portion 151 to drive the auxiliary head belt 181 to be moved.

Taking the cooperation between the first gear 160 and the first elastic positioning element 190a as an example, each first elastic abutting portion 191a has a first forward surface 192a and a first stopping surface 193a opposite to each other, and each slot 162 has a second forward surface 162a and a second stopping surface 162b opposite to each other. The first forward surface 192a of each first elastic abutting portion 191a is configured to abut against the second forward surface 162a of any of the slots 162, and the first stopping surface 193a of each first elastic abutting portion 191a is configured to abut against the second stopping surface 162b of any of the slots 162. Therefore, when the movement of the auxiliary head belt 181 is temporarily restricted, the first forward surfaces 192a may slide through the second forward surfaces 162a, so that the first elastic positioning element 190a and the first gear 160 are slipped off. When the first elastic positioning element 190a is reversed, the first stopping surfaces 193a and the second stopping surfaces 162b are engaged with each other to synchronously rotate the first gear 160, the first elastic positioning element 190a and the shaft portion 151. The structural designs and operation principles of the slots 172 of the second gear 170 and the second elastic abutting portions 191b of the second elastic positioning element 190b are identical or similar thereto, and details thereof are not repeated hereinafter.

In summary, with the integrated design of the knob and the double gears in the invention, the user may drive the double gears to be rotated by rotating the knob, and the auxiliary head belt, the first side head belt and the second side head belt may be driven to move synchronously by the synchronously rotating double gears. As a result, the degree of tightness may be quickly adjusted when the user wears the head-mounted display. In other words, the head-mounted display of the invention is convenient to use.

Although the embodiments are already disclosed as above, these embodiments should not be construed as limitations on the scope of the invention. It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A head-mounted display, comprising:
a body;
a bearing base, disposed opposite to the body;
a separation plate, fixed inside the bearing base;
a knob, pivoted to the bearing base and located outside the bearing base;
a guiding element, pivoted to the bearing base and located inside the bearing base and configured to be driven by the knob to rotate, wherein the guiding element comprises a shaft portion passing through the bearing base and the separation plate;
a first gear, sleeved on the shaft portion;
a second gear, sleeved on the shaft portion, wherein the first gear and the second gear are separated from each other by the separation plate; and
a head belt set, connecting the body and the bearing base, the head belt set comprising:
an auxiliary head belt, having an auxiliary gear rack portion extending into the bearing base, wherein the first gear is engaged with an auxiliary inner gear rack of the auxiliary gear rack portion;
a first side head belt, having a first gear rack portion extending into the bearing base, wherein the auxiliary gear rack portion and the first gear rack portion are separated from each other by the separation plate; and
a second side head belt, having a second gear rack portion extending into the bearing base, wherein the second gear rack portion is stacked on the first gear rack portion, and the second gear is engaged with a first inner gear rack of the first gear rack portion and a second inner gear rack of the second gear rack portion.

2. The head-mounted display according to claim 1, wherein the bearing base comprises an internal ratchet portion, the knob is pivoted to the internal ratchet portion and located on the internal ratchet portion, and the guiding element further comprises a positioning portion, wherein the positioning portion is located inside the internal ratchet portion and is configured to be engaged with a plurality of internal ratchet teeth of the internal ratchet portion.

3. The head-mounted display according to claim 2, wherein the knob comprises a driving portion located inside the internal ratchet portion, the positioning portion has an engaging portion and a driven portion that are opposite to each other, and the driving portion is located between the engaging portion and the driven portion and is configured to be rotated relative to the internal ratchet portion to push the driven portion or to push the engaging portion.

4. The head-mounted display according to claim 3, wherein the guiding element further comprises a stopping portion, the driven portion and the stopping portion are connected to an outer peripheral surface of the shaft portion, the stopping portion is located at one side of the driven portion, and the engaging portion is connected to the driven portion and extends to one side of the stopping portion.

5. The head-mounted display according to claim 4, wherein a gap is maintained between the engaging portion and the shaft portion, and the stopping portion is located inside the gap.

6. The head-mounted display according to claim 1, wherein the bearing base comprises a plurality of limiting portions located around the first gear and the second gear and configured to define two limiting channels, the auxiliary gear rack portion is slidably disposed inside one of the two limiting channels, and the first gear rack portion and the second gear rack portion are slidably disposed inside the other one of the two limiting channels.

7. The head-mounted display according to claim 1, wherein the auxiliary gear rack portion is perpendicular to the first gear rack portion and the second gear rack portion.

8. The head-mounted display according to claim 1, further comprising:
an elastic positioning element, engaged with the shaft portion and surrounded by the first gear, wherein the elastic positioning element comprises an elastic abutting portion configured to abut against a plurality of slots on an inner peripheral surface of the first gear.

9. The head-mounted display according to claim 8, wherein the elastic abutting portion has a first forward surface and a first stopping surface opposite to each other, and each of the plurality of slots has a second forward surface and a second stopping surface opposite to each other, wherein the first forward surface is configured to abut against any one of the second forward surfaces, and the first stopping surface is configured to abut against any one of the second stopping surfaces.

10. The head-mounted display according to claim 1, further comprising:
an elastic positioning element, engaged with the shaft portion and surrounded by the second gear, wherein the elastic positioning element comprises an elastic abutting portion configured to abut against a plurality of slots on an inner peripheral surface of the second gear.

11. The head-mounted display according to claim 10, wherein the elastic abutting portion has a first forward surface and a first stopping surface opposite to each other, and each of the plurality of slots has a second forward surface and a second stopping surface opposite to each other, wherein the first forward surface is configured to abut against any one of the second forward surfaces, and the first stopping surface is configured to abut against any one of the second stopping surfaces.

* * * * *